(12) United States Patent
Worl

(10) Patent No.: US 8,119,922 B2
(45) Date of Patent: Feb. 21, 2012

(54) DUAL CAVITY, HIGH-HEAT DISSIPATING PRINTED WIRING BOARD ASSEMBLY

(75) Inventor: Robert T. Worl, Renton, WA (US)

(73) Assignee: The Boeing Company, Chicago, IL (US)

( * ) Notice: Subject to any disclaimer, the term of this patent is extended or adjusted under 35 U.S.C. 154(b) by 677 days.

(21) Appl. No.: 12/242,229

(22) Filed: Sep. 30, 2008

(65) Prior Publication Data

US 2009/0025969 A1    Jan. 29, 2009

Related U.S. Application Data

(62) Division of application No. 11/567,906, filed on Dec. 7, 2006, now Pat. No. 7,444,737.

(51) Int. Cl.
| | |
|---|---|
| H05K 1/00 | (2006.01) |
| H05K 1/03 | (2006.01) |
| H05K 1/09 | (2006.01) |
| H05K 1/14 | (2006.01) |
| H05K 7/00 | (2006.01) |
| H05K 1/18 | (2006.01) |

(52) U.S. Cl. ........ 174/257; 174/252; 174/255; 174/256; 361/736; 361/746; 361/761; 361/762; 361/763

(58) Field of Classification Search .......... 174/250–268; 361/736–812
See application file for complete search history.

(56) References Cited

U.S. PATENT DOCUMENTS

| | | | |
|---|---|---|---|
| 5,502,889 A | 4/1996 | Casson et al. | |
| 5,557,142 A | 9/1996 | Gilmore et al. | |
| 5,671,525 A | 9/1997 | Fidalgo | |
| 5,688,584 A | 11/1997 | Casson et al. | |
| 6,020,848 A | 2/2000 | Wallace et al. | |
| 6,137,377 A | 10/2000 | Wallace et al. | |
| 6,137,693 A | 10/2000 | Schwiebert et al. | |
| 6,195,047 B1 | 2/2001 | Richards | |
| 6,201,689 B1 | 3/2001 | Miyasyo | |
| 6,271,728 B1 | 8/2001 | Wallace et al. | |
| 6,320,543 B1 | 11/2001 | Ohata et al. | |
| 6,335,669 B1* | 1/2002 | Miyazaki et al. | 333/247 |
| 6,388,636 B1 | 5/2002 | Brown et al. | |
| 6,538,312 B1* | 3/2003 | Peterson et al. | 257/680 |
| 6,686,656 B1* | 2/2004 | Koh et al. | 257/686 |
| 6,815,739 B2 | 11/2004 | Huff et al. | |
| 6,910,636 B2 | 6/2005 | Kim et al. | |
| 6,950,314 B2 | 9/2005 | Reznik et al. | |
| 7,045,440 B2 | 5/2006 | Huff et al. | |
| 7,168,152 B1 | 1/2007 | Ehret et al. | |
| 7,388,756 B1 | 6/2008 | Worl et al. | |
| 2002/0050407 A1* | 5/2002 | Sohn et al. | 174/262 |
| 2002/0053735 A1 | 5/2002 | Neuhaus et al. | |
| 2004/0004819 A1 | 1/2004 | Wong | |
| 2006/0237537 A1 | 10/2006 | Empedocles et al. | |
| 2007/0273008 A1 | 11/2007 | Suzuki | |

OTHER PUBLICATIONS

Non-Final Office Action on co-pending U.S. Appl. No. 11/567,692 dated Nov. 25, 2008.

* cited by examiner

Primary Examiner — Jayprakash N Gandhi
Assistant Examiner — Jerry Wu
(74) Attorney, Agent, or Firm — Yee & Associates, P.C.

(57) ABSTRACT

Two panel-sized fully populated printed wiring board assemblies formed together, with an anisotropic epoxy that provides electrical connection for RF signals and DC supplies without the need for wirebonds, mechanical interconnects or solder balls.

9 Claims, 6 Drawing Sheets

DUAL CAVITY, HIGH-HEAT DISSIPATING PRINTED WIRING BOARD ASSEMBLY

CROSS-REFERENCE TO RELATED APPLICATIONS

This application is a divisional of application Ser. No. 11/567,906, filed on Dec. 7, 2006, now U.S. Pat. No. 7,444,737, the entire contents of which are hereby incorporated by reference.

BACKGROUND

1. Field of the Invention

This invention is directed to printed wiring board assemblies and more particularly, to a high-heat dissipating RF antenna assembly using a printed wiring board.

2. Related Art

The constant demand for faster communication systems and more sensitive radar systems is pushing the phased array industry to move designs to accommodate higher power levels and higher frequencies. This demand makes it difficult to produce phased arrays inexpensively and compactly. For low-power, low-frequency applications, Chip-on-Board (COB) technology provides an affordable solution. However, for high-power phased arrays, which are critical components of high-speed long-range communications and state of art radar applications, COB technology can no longer provide a satisfactory solution due to its limited power handling capability. The limiting factor for highly sensitive radars and long-range communications antenna systems is their higher power output requirements. Typically, to deliver the required power, traditional antenna systems rely on using exotic ceramic materials and complex multi-part assemblies. These materials are also expensive and require long manufacturing lead times.

Therefore, what is needed is an apparatus and associated method that allows the manufacture of low cost high-heat dissipating phased array assembly.

SUMMARY OF THE INVENTION

In one aspect of the present invention, a method for manufacturing dual cavity, high-heat dissipating printed wiring board assembly is provided. This method for manufacturing the printed wiring board comprises: providing a first laminate stackup and a second laminate stackup, having a plurality of conductive and dielectric layers, including vias within each stackup, cutouts and alignment holes through each stackup; attaching a heatsink and standoffs to the first stackup; routing out an anisotropic conductive film (ACF) sheet; placing and aligning the ACF sheet over the lower stackup; inverting and assembling upper stackup onto lower stackup; and curing the ACF to join the stackups together.

In another aspect of the present invention, a structure for a dual cavity, high-heat dissipating printed wiring board assembly is provided. The structure for the printed wiring board assembly comprises: an upper and a lower laminate stackup, each having a first side and a second side, and at least one cutout area, wherein the cutout area of the upper stackup extending from the first side to the second side of the stackup; an anisotropic material layer disposed between the two stackups providing mechanical and electrical connection between the stackups; and a heatsink laminated to the upper stackup.

This brief summary has been provided so that the nature of the disclosure may be understood quickly. A more complete understanding of the invention may be obtained by reference to the following detailed description of embodiments thereof in connection with the attached drawings.

BRIEF DESCRIPTION OF THE DRAWINGS

The foregoing features and other features of the present disclosure will now be described with reference to the drawings. In the drawings, the same components have the same reference numerals. The illustrated embodiment is intended to illustrate, but not to limit the invention. The drawings include the following Figures.

DETAILED DESCRIPTION

Definitions

The following definitions are provided as they are typically (but not exclusively) used in relation to printed wiring board technology, referred to in various aspects of the present disclosure.

A "stackup" is an arrangement of various layers of conductive and dielectric materials stacked together to form a multi-layer board.

A "laminate" is a structure used to unite conductive and dielectric layers together.

A "honeycomb" is a circular cell configuration including the antenna radiating aperture, which in the present application permits RF transmission from the printed wiring board to free-space while also acting as the front face of the antenna enclosure.

To facilitate an understanding of the embodiments of the present disclosure, the general architecture and the process of making a printed wiring board assembly suitable for RF antenna applications are described. The specific architecture and process of the present invention are described with reference to the general architecture and process.

Figure 1:
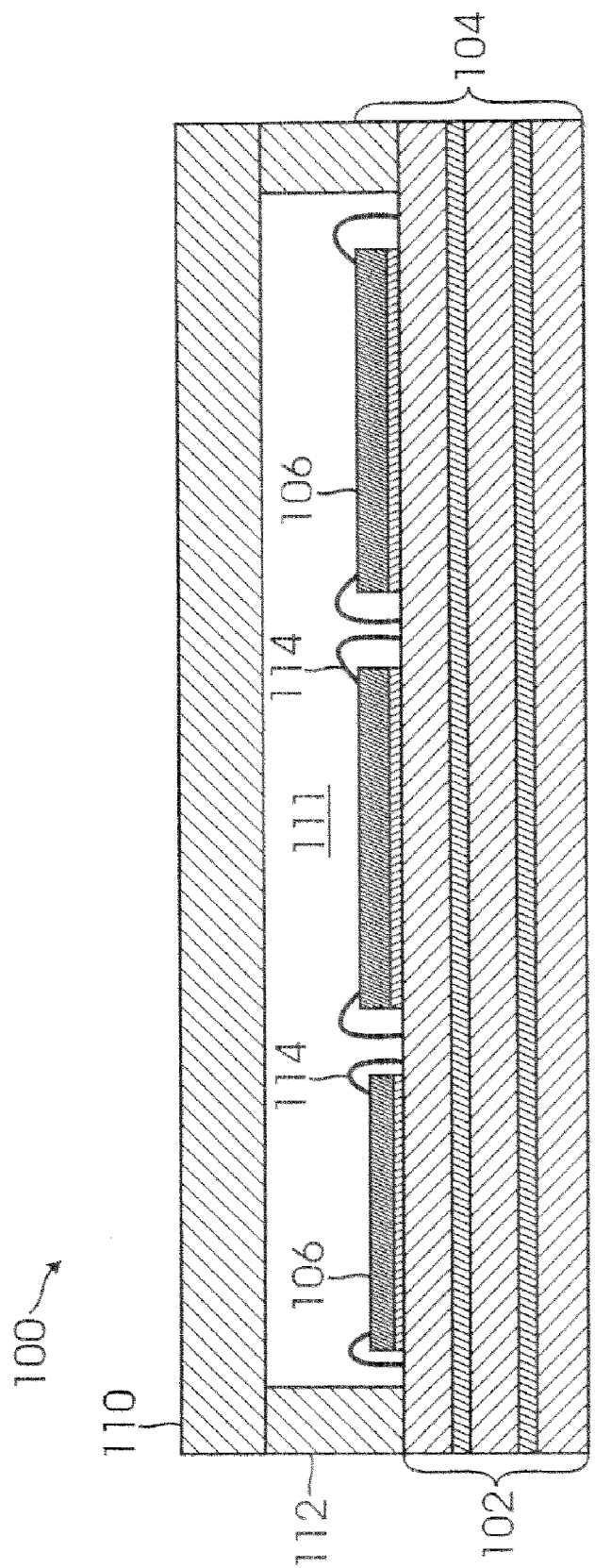
FIG. 1 is a simplified cross sectional view of a conventional COB package for an RF antenna application.

FIG. 1 is a simplified cross sectional view of module 100, having a traditional printed wiring board (PWB) 102 with a COB structure 104, a heat sink 110, and a seal ring 112. As shown in FIG. 1, module 100 combined together with heat sink 110 and seal ring 112 defines an enclosed space 111. Seal ring 112 is coupled to PWB 102 around a periphery of ICs or chipset 106. Heatsink 110 is attached to seal ring 112 to enclose module 100 and create enclosed space 111. It should be understood that each individual module 100 is sealed, even when combined with other modules to create large PWBs containing multiple sites.

A number of ICs or chipsets 106, such as ASICs and a MMICs are enclosed in enclosed space 111 between PWB 102 and heat sink 110 and encircled by seal ring 112. In this example, ICs 106 are disposed horizontally on PWB 102 alongside one another inside enclosed space 111. The ICs 106 are electrically coupled together using PWB 102 and a plurality of wirebonds 114. Generally, module 100 is not suitable for high power applications, because its heat evacuation capability is limited, primarily since ICs 106 are not in direct contact with heatsink 110.

Figure 2:
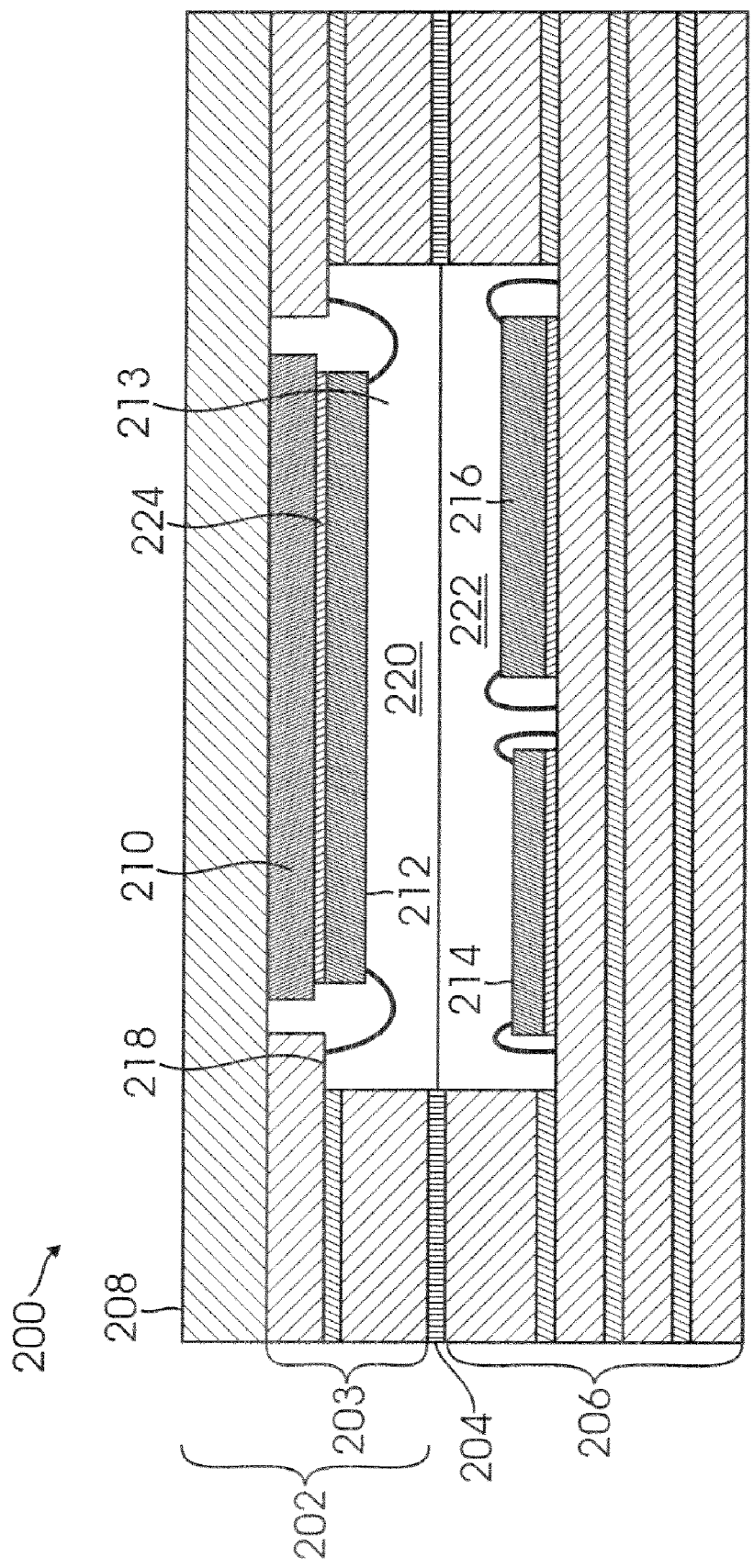
FIG. 2 shows a simplified cross sectional view of a dual cavity high heat dissipating printed wiring board assembly, in accordance with an embodiment of the present disclosure.

FIG. 2 shows a cross sectional view of a dual cavity high heat dissipating PWB assembly 200 (hereinafter "assembly 200") in accordance with an embodiment of the present disclosure. In this embodiment, assembly 200 includes a first PWB assembly 202 and a second PWB assembly 206 formed to define an enclosed space 213. As described below, enclosed space 213 results from the joining of the two fully assembled PWB assemblies 202 and 206, using a conductive epoxy 204, such as Anisotropic Conductive Film sheet (hereinafter "ACF 204"). ACF sheet 204 provides a connection for RF and DC signals, without the need for other interconnect means, such as wirebonds, mechanical interconnects or solder balls.

In one embodiment, first PWB assembly 202 is designed to provide superior heat dissipation for high power ICs. In this embodiment, first PWB assembly 202 includes; a multilayer stackup 203, a heatsink 208, and a standoff 210. Stackup 203 includes a cutout portion 220 and has heatsink 208 laminated on its top side. Standoff 210 is disposed inside cutout portion 220 and is attached to heatsink 208. Standoff 210 may be used to elevate high power ICs, such as IC 212, to bonding-pedestal 218 and provides a heat conduction path from IC 212 to heatsink 208.

In one embodiment, the structure of second PWB assembly 206 includes a traditional COB structure, the nature of which is known in the art. In this embodiment, ICs 214 and 216 are disposed horizontally alongside one another in enclosed cutout portion 222.

Figure 3A:
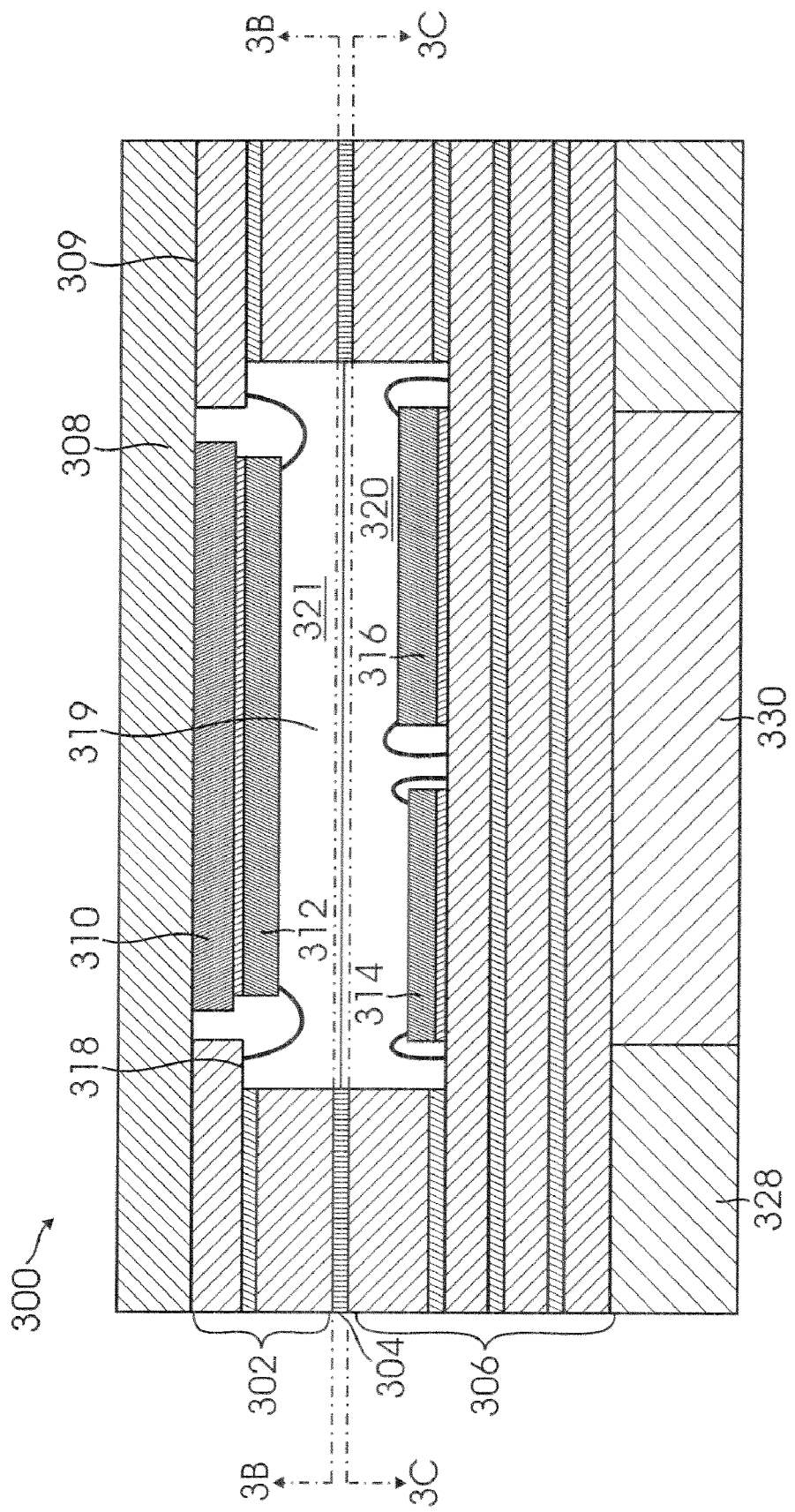
FIG. 3A shows a simplified cross sectional view of a unit cell of a RF antenna assembly using a dual cavity high heat dissipating printed wiring board, in accordance with an embodiment of the present disclosure.
Figure 3B:
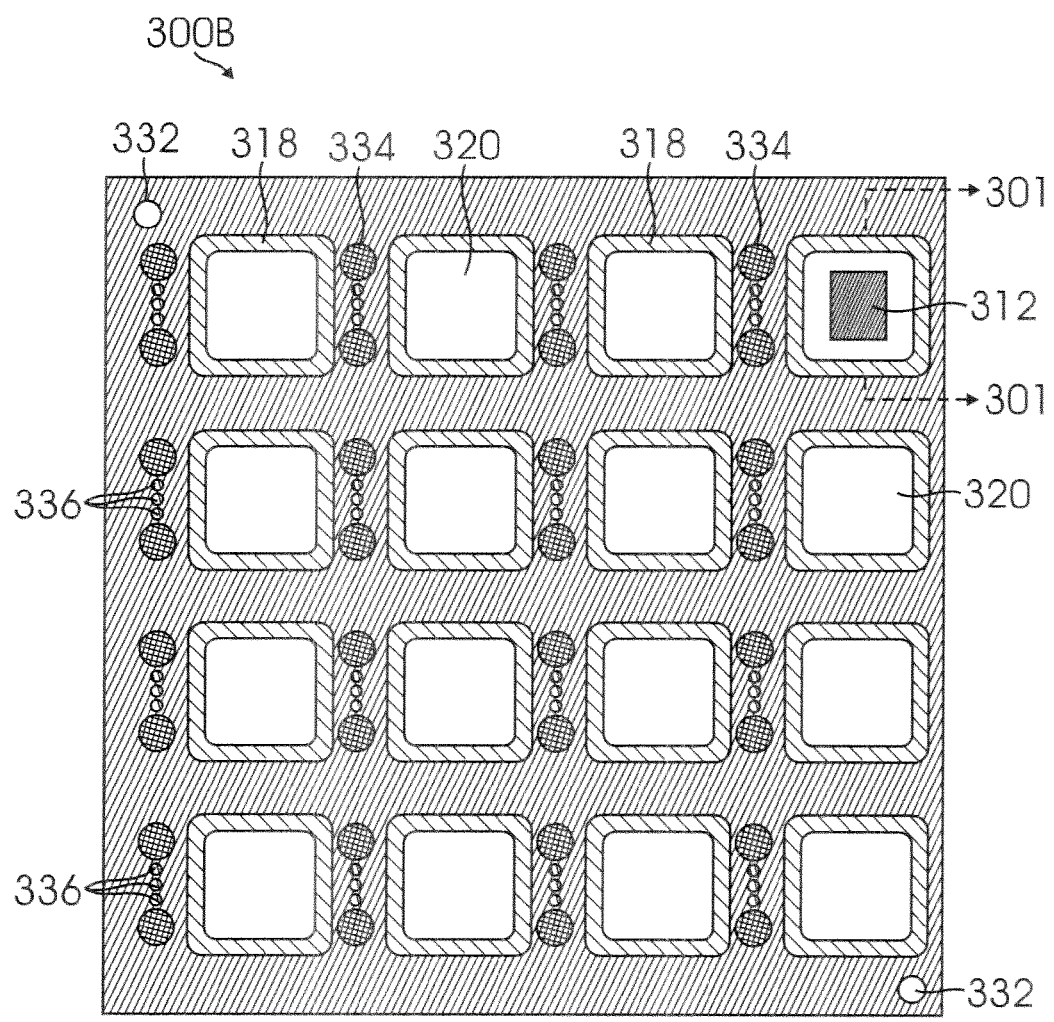
FIGS. 3B and 3C show a simplified bottom view of an upper and top view of a lower board of a 16 cell RF antenna assembly, in accordance with an embodiment of the present disclosure.
Figure 3C:
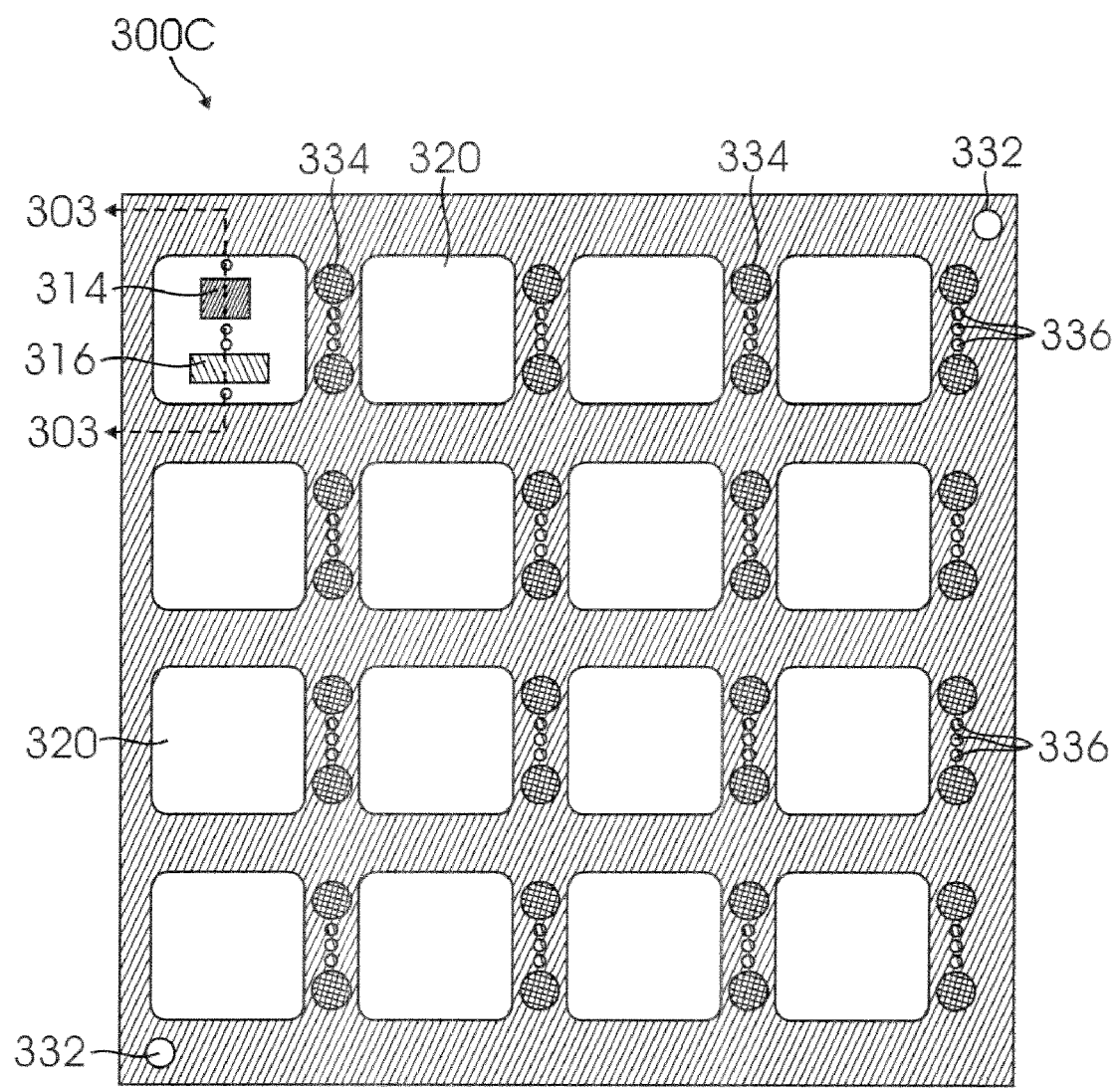

As understood from FIG. 2, first PWB assembly 202 and second PWB assembly 206 are joined such that cutout portions 220 and 222 are combined to define and create enclosed space 213, in which ICs 212, 214 and 216 are disposed. FIGS. 3A, 3B and 3C show three different views of a high power RF antenna assembly 300 (hereinafter "assembly 300"). FIG. 3A shows a cross sectional view of a unit area of assembly 300. FIG. 3B shows the bottom side's view of an upper printed wiring board assembly 302B and FIG. 3C shows the top side's view of a lower printed wiring board assembly 302C.

Assembly 300 includes, precut ACF sheet 304 interposed between fully populated assembly 300B (FIG. 3B) and fully populated assembly 300C (FIG. 3C). ACF sheet 304 joins assemblies 300B and 300C together mechanically as well as electrically. ACF sheet 304 provides RF and DC signal connection without the need for other interconnection means, such as wirebonds, mechanical interconnects or solder balls.

Assembly 300 further includes a plurality of antenna aperture structures 330 imbedded in a honeycomb structure 328, and attached to a bottom side of assembly 300C. In one embodiment, a pair of alignment holes 332 and alignment pins (not shown), are disposed in at least one corner of assembly 300 to ensure a proper corresponding alignment of the assemblies.

Assembly 300B (FIG. 3B) includes; multilayer stackup 302, heatsink 308, standoff 310 and IC 312, such as a high power MMIC. Stackup 302 includes cutout portion 321 and has heatsink 308 laminated on a first side 309. A standoff 310 is disposed inside cutout portion 321 and is coupled to heatsink 308. Standoff 310, which may be made from any heat conductive material, such as Molybdenum, elevates IC 312 to wirebonding-pedestal 318 and provides heat conduction from IC 312 to heatsink 308. IC 312 is wirebonded to stackup 302 at wirebonding-pedestal 318.

Disposed on the bottom side of stackup 302 are arrays of transition points 334 and 336, which provide transition points for RF signals and DC supplies, respectively. Transition points 334 and 336 are the locations where AFC sheet 304 establishes electrical contact between assemblies 300B and 300C.

Assembly 300C (FIG. 3C) includes a multilayer stackup 306, and a plurality of ICs 314 and 316, such as ASICs and MMICs, respectively. Stackup 306 has cutout portion 320 in which ICs 314 and 316 may be positioned. For example, at cutout portion 320 ICs 314 316 may be physically coupled to stackup 306 and electrically connected to it with, for example, wirebonds. Disposed on the top side of stackup 306 are arrays of transition points 334 and 336.

In one embodiment, multilayer stackups 302 and 306 may be constructed from double-sided RF grade laminate material.

Figure 4:
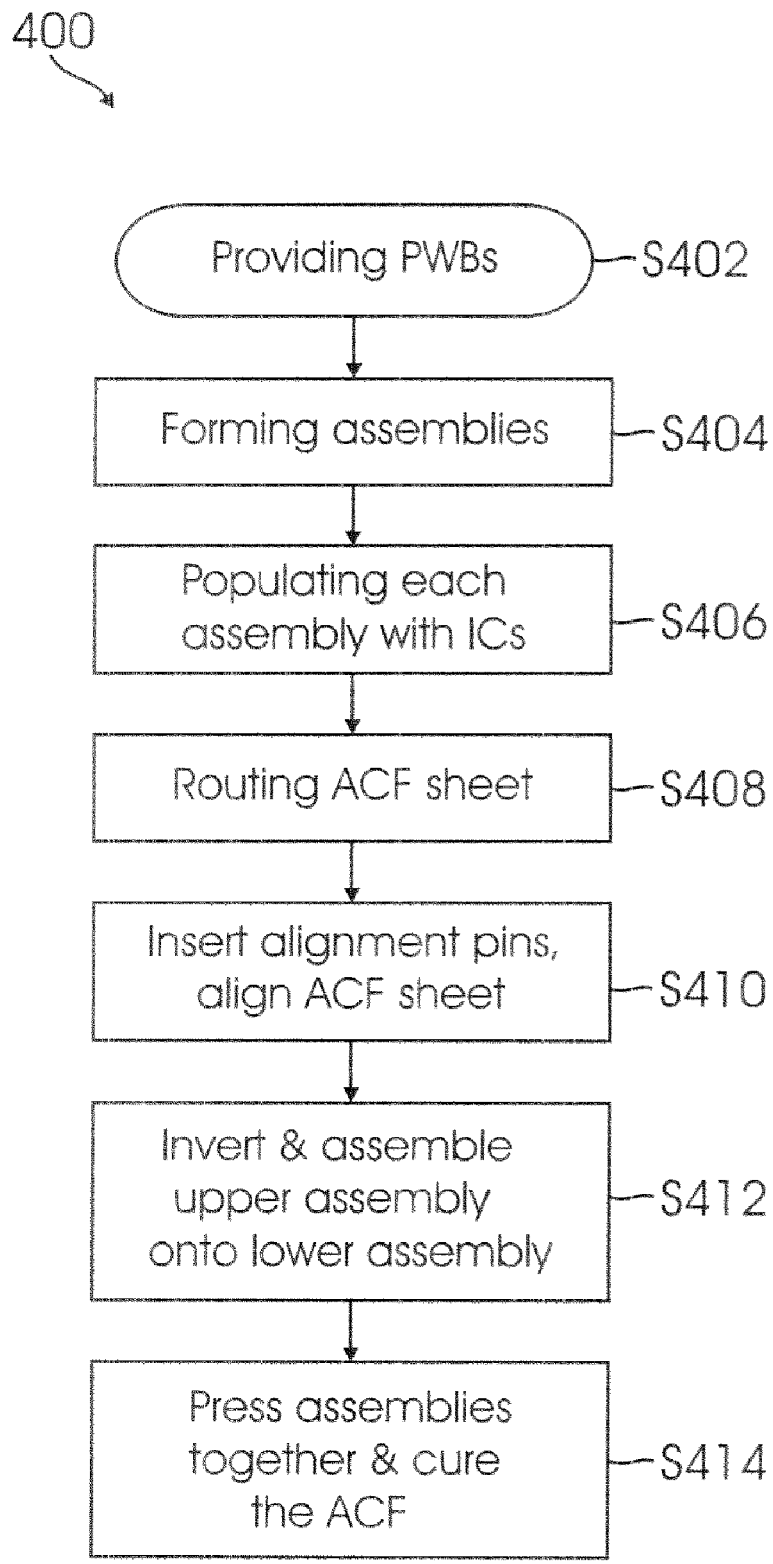
FIG. 4 is a flowchart showing a method of producing a dual cavity high heat dissipating printed wiring board assembly in accordance with an embodiment of the present disclosure.

FIG. 4 is a flowchart, illustrating a method 400 for producing a dual cavity, high-heat dissipating PWB assembly, according to one aspect of the present disclosure.

Referring now to FIGS. 3A and 4, in step S402, multilayer stackups 302 and 304 are provided. Stackups 302 and 304 are pre-routed in a predefined area to form cutout portions 320 and 321.

In step S404, heatsink 308 is laminated onto stackup 302 and standoff 310 is attached to heatsink 308.

In step S406, stackups 302 and 306 are populated with ICs 312, 314 and 316. In one embodiment, ICs 314 and 316 are positioned within cutout portion 320 of stackup 306, while IC 312 is positioned on standoff 310.

In step S408, ACF sheet 304 is routed to remove portions of ACF sheet 304, which overlay and correspond to cutout portions 320 and 321 and alignment holes 332.

In step S410, alignment pins (not shown) are inserted into assembly 300C in alignment holes 332. ACF sheet 304 is then aligned and placed over assembly 300C (FIG. 3C).

In step S412, assembly 300B (FIG. 3B) is inverted, aligned, and deposited onto the ACF covered assembly 300C. The combination of assembly 300B and assembly 300C to form assembly 300 define and create enclosed space 319. As a result of the combination, ICs 312, 314 and 316 are positioned and enclosed within enclosed space 319.

In step S414, assemblies 300B and 300C are pressed together, while ACF sheet 304 is cured under pressure at a predetermined temperature.

In one embodiment, thereafter, a plurality of antenna apertures 330 are imbedded in a honeycomb structure 328 and are attached to a bottom side of assembly 300C to form assembly 300.

The embodiments disclosed provide a packaging structure and method, which allows for a higher operating frequency, and higher power output. Packaging density may be doubled, while assembly complexity and manufacturing costs may be reduced and system reliability may be enhanced. The packaging structure also allows for building panel sized PWB assemblies.

Although the present technology has been described with reference to specific embodiments, these embodiments are illustrative only and not limiting. Many other applications and embodiments of the present disclosure will be apparent in light of this disclosure and the following claims.

What is claimed is:

1. A structure for a printed wiring board assembly comprising:

a first laminate stackup, having a first side and a second side, and a first cutout area defined on the first side of the first laminate stackup, wherein the first cutout area does not extend to the second side of the first laminate stackup;

a second laminate stackup, having a first side and a second side, and a second cutout area extending from the first side to the second side of the second laminate stackup, wherein the first side of the first laminate stackup is connected to the first side of the second laminate stackup with the first cutout area aligned with the second cutout area;

an anisotropic material layer disposed between the first laminate stackup and the second laminate stackup providing mechanical and electrical connection therebetween;

a heatsink, having a first side and a second side, laminated to the second side of the second laminate stackup and extending across the second cutout area, wherein the first laminate stackup, the second laminate stackup, and the first side of the heatsink define an enclosed space including the first cutout area and the second cutout area;

a first integrated circuit attached to the first laminate stackup in the first cutout area; and a second integrated circuit attached to the first side of the heatsink in the enclosed space.

2. The structure of claim 1, wherein the first laminate stackup and the second laminate stackup comprise double-sided printed wiring boards having conductive traces.

3. The structure of claim 1, wherein layers of the first laminate stackup and the second laminate stackup facing the anisotropic material layer include transition points to make electrical connection with the anisotropic material layer.

4. The structure of claim 1, wherein the first laminate stackup and the second laminate stackup comprise RF grade material.

5. The structure of claim 1, wherein the heatsink comprises at least one thermally conductive standoff between the heatsink and the second integrated circuit.

6. The structure of claim 5, wherein the at least one thermally conductive standoff holds and elevates the second integrated circuit to a wirebonding layer, and provides heat conduction between the second integrated circuit and the heatsink.

7. The structure of claim 5, wherein the at least one thermally conductive standoff comprises molybdenum.

8. The structure of claim 1, further comprising an antenna aperture structure attached to the second side of the first laminate stackup and aligned with the enclosed space.

9. The structure of claim 8, wherein the antenna aperture structure is embedding in an honeycomb structure.

* * * * *